(12) United States Patent
Card et al.

(10) Patent No.: US 7,910,156 B2
(45) Date of Patent: Mar. 22, 2011

(54) METHOD OF MAKING CIRCUITIZED SUBSTRATE WITH SELECTED CONDUCTORS HAVING SOLDER THEREON

(75) Inventors: Norman A. Card, Lockwood, NY (US); Robert J. Harendza, Lisle, NY (US); John J. Konrad, Endicott, NY (US); Tonya L. Mosher, Apalachin, NY (US); Susan Pitely, Vestal, NY (US); Jose A. Rios, Binghamton, NY (US)

(73) Assignee: Endicott Interconnect Technologies, Inc., Endicott, NY (US)

( * ) Notice: Subject to any disclaimer, the term of this patent is extended or adjusted under 35 U.S.C. 154(b) by 991 days.

(21) Appl. No.: 11/730,212

(22) Filed: Mar. 30, 2007

(65) Prior Publication Data

US 2008/0241359 A1    Oct. 2, 2008

(51) Int. Cl.
    *B05D 5/12* (2006.01)
(52) U.S. Cl. ............... 427/97.7; 427/96.1; 427/97.1; 427/98.4
(58) Field of Classification Search ............ 427/96.1, 427/97.1, 97.7, 98.4
    See application file for complete search history.

(56) References Cited

U.S. PATENT DOCUMENTS

| | | |
|---|---|---|
| 4,702,792 A | 10/1987 | Chow et al. |
| 4,775,611 A | 10/1988 | Sullivan |
| 5,084,071 A | 1/1992 | Nenadic et al. |
| 5,118,385 A | 6/1992 | Kumar et al. |
| 5,134,056 A * | 7/1992 | Schmidt et al. ............ 430/313 |
| 5,160,579 A | 11/1992 | Larson |
| 5,308,796 A | 5/1994 | Feldman et al. |
| 5,309,632 A * | 5/1994 | Takahashi et al. ............ 29/852 |
| 5,338,645 A | 8/1994 | Henderson et al. |
| 5,358,622 A | 10/1994 | Korsten |
| 5,468,409 A | 11/1995 | Dull |
| 5,494,781 A | 2/1996 | Ohtani et al. |
| 5,502,893 A | 4/1996 | Endoh et al. |
| 6,547,974 B1 | 4/2003 | Albrechta et al. |
| 7,087,441 B2 | 8/2006 | Konrad et al. |
| 7,169,313 B2 | 1/2007 | Card et al. |
| 2002/0152925 A1* | 10/2002 | Soutar et al. ............... 106/1.22 |

FOREIGN PATENT DOCUMENTS

GB    2087157 A  *  5/1982

* cited by examiner

*Primary Examiner* — Brian K Talbot
(74) *Attorney, Agent, or Firm* — Mark Levy; Lawrence R. Fraley; Hinman, Howard & Kattell

(57) ABSTRACT

A method of making a circuitized substrate in which conductors are formed in such a manner that selected ones of the conductors include solder while others do not and are thus adapted for receiving a different form of connection (e.g., wire-bond) than the solder covered conductors. In one embodiment, the solder may be applied in molten form by immersing the substrate within a bath of the solder while in another the solder may be deposited using a screening procedure.

11 Claims, 7 Drawing Sheets

METHOD OF MAKING CIRCUITIZED SUBSTRATE WITH SELECTED CONDUCTORS HAVING SOLDER THEREON

TECHNICAL FIELD

The invention relates to the manufacture of circuitized substrates such as printed circuit boards, chip carriers and the like, and particularly to such manufacture wherein at least some of said conductors include solder thereon.

BACKGROUND OF THE INVENTION

Printed circuit boards (hereinafter also referred to simply as PCBs), chip carriers, and similar circuitized substrate products typically present one and often two (opposing) planar surface(s) on which electronic components such as semiconductor chips, resistors, capacitors, modules, etc. are to be mounted. As known, PCBs may also have one or more chip carriers (each including one or more chips as part thereof) mounted thereon, while such chip carriers in turn may have the chips mounted to the substrates thereof, typically utilizing wire-bond or solder reflow technologies. (One example of a chip carrier is made and sold by the Assignee of the invention and is called the HyperBGA chip carrier, which includes a laminate substrate-conductor layer structure on which is positioned one or more semiconductor chips. HyperBGA is a registered trademark of the Assignee, Endicott Interconnect Technologies, Inc.) Circuit paths for these components are also typically provided by forming conductive lines (often referred to as traces) on the surface(s) that often connect the conductors (sometimes referred to simply as pads) to "thru-holes" in the substrate, for those components to which such connections are required, as well as simply between the conductors if only surface coupling is desired. It is also known to directly connect the leads of such components to the thru-holes, e.g., to lands which surround same. By the term "thru-holes" as used herein is meant to include three types of conductive holes: (1) those referred to as "blind vias", which extend within part of the board from an outer surface (thus to a "blind" depth); (2) internal "vias" which are located entirely within the board's structure (and thus covered by external layering); and (3) holes that pass entirely through the board (also referred to in the printed circuit field as plated-through-holes or PTHs. Such holes are usually formed by mechanical or laser drilling and then electroplating of the internal surfaces with suitable conductive material, e.g., copper.

In the case of components with projecting metal leads (e.g., DIPs, or dual inline packages), these leads are typically electrically connected to selected ones of the conductors using solder. Another form of connection involves the use of solder balls. One example involves using solder balls to directly couple contact sites (e.g., aluminum pads) of a chip to such pads, such as those on either a PCB or chip carrier, using conventional solder re-flow processing in which the solder balls are initially formed on the sites and then re-flowed once positioned on the pads. One form of such re-flow processing is referred to in the industry as "C4" processing, meaning controlled collapse chip connection processing. Thus, these solder balls serve as "leads" between the sites and pads in place of the metal members such as on DIPs, but in a different manner than the projecting leads of metal. Such solder connections are especially desirable in the industry to connect chips to substrates as well as chip carriers to PCBs, primarily due to the savings in substrate "real estate." Such savings are extremely important in order to satisfy today's continuous demands for miniaturization.

PCBs and chip carriers made today often include several dielectric (e.g., a glass fiber-resin combination material known as "FR4") layers interspersed with the requisite number of conductive (e.g., copper) layers, which may be in the form of signal, power or ground layers. Other examples of the materials for both dielectric and conductive layers are provided herein-below. For such internal signal layers, the connecting lines thereof are also typically formed using the same processing as the external surface conductors and connecting lines, with the formed dielectric and conductor layers of this sub-composite then aligned and bonded to other sub-composites, typically using conventional lamination processes, to form the final multilayered (composite) structure.

PCBs and chip carriers are generally manufactured using either a subtractive etch process, a pattern plating process, or an electro-less pattern plating process (also referred to as additive pattern plating). In all of these processes, a circuit mask that lays out the desired pattern of the conductive lines is transferred to the substrate by printing the circuit mask pattern onto a polymeric radiation-sensitive resist material (more simply referred to as photo-resist or, more simply, as resist) deposited on the substrate surface(s). This resist material is irradiated in the pattern of the circuit mask so that it is physically transformed where it is irradiated and is unchanged where shielded by the circuit mask. The resist material is then "developed" by exposing it to a fast-reacting chemical solution that selectively removes either the irradiated material (called a positive resist) or removes the non-irradiated material (called a negative resist).

Subtractive etching typically begins with a substrate comprised of a non-conductive (dielectric) material on which at least one (and often two) layer(s) of conductive material such as copper has been plated or laminated. A layer of photo-resist material is then deposited and "developed" in the circuit mask pattern so as to expose the conductive material where circuit paths are not desired. The exposed conductive material in the photo-resist voids is then etched away. Finally, the remaining photo-resist material is removed, leaving behind conductive lines wherever circuit paths were desired. The subtractive etch process provides good control over circuit path height because the amount of conductive material plated onto the substrate can be generally controlled very well. Precisely controlled circuit path height is especially important with surface mount techniques, especially when forming fine line circuitry with highly dense patterns. The subtractive etch process, however, generally does not provide as precise control over circuit path width as does additive plating, due to plating variation and lack of sharply defined path edges. While subtractive etch processing may be used for high density applications, greater width control is often desired.

Pattern plating (also referred to as acid plate pattern plating) uses electro-plating techniques to deposit conductive lines in circuit paths defined by photo-resist material voids. More specifically, a conductive foil layer on the circuit board is connected to an electrode and the conductive material is deposited onto the board in the resist material voids using an oppositely charged electrode. The width of the conductive lines is generally dependant on the developed photo-resist pattern, which typically is of photographic sharpness. Pattern plating thereby provides good control over circuit path width and permits conductive lines of relatively fine width. The circuit path height, however, is not as easily controlled because such height is dependent on the density of the desired conductive lines. As a result, isolated conductive lines are typically thicker than densely packed (closely spaced) conductive lines. Thus, line height is sometimes not as precisely controlled by the acid plate process as may be desired, especially where higher densification is demanded.

Additive (electro-less) plating processing is similar to the acid plate pattern process, except that chemical plating processes are used rather than electro-plating processes. Additive plate fabrication generally requires more time to complete as compared to acid plate pattern fabrication but is typically not as susceptible to circuit path height variation according to line density. Additive plating may occasionally result in copper nodule formation, however, if not performed in a precise manner and under carefully controlled conditions.

Surfaces of substrates often need to be planarized during manufacture. Planarization methods such as surface machining remove non-planar regions of the board. Chemical mechanical polish, another often used method also employed in the semiconductor and ceramic industries, contains abrasive slurry materials which attack both resist and copper surfaces. Such polishing techniques are not compatible with many organic-based substrates, which are often used in conjunction with surface-mount technology substrates. Surface-mount technology utilizing solder ball connections as described above is popular today because it permits higher component densities and faster component mounting as compared with more conventional wire-bonding techniques in which it is necessary to electrically interconnect several small contacts and conductor sites with fine, delicate wires. Such polishing techniques are generally incompatible with organic based substrates because such substrates are somewhat flexible and typically have surface undulations. The surface undulations are due to variations in substrate thickness and also to the inherent flexibility of the substrates, which permits bowing and warping. Conventional chemical-mechanical polishing techniques will not follow these undulations and contours of flexible substrates. As a result, substrate areas of extra thickness or that bow outward will be left with conductive lines having areas that are too thin, and board areas of reduced thickness will be left with conductive lines having areas that are too thick.

As stated, many connections to conductors on the external surfaces of circuitized substrates of the kind mentioned above involve the use of solder. In addition to solder balls which connect the conductors to such conductors as aluminum contact sites on a semiconductor chip, it is often desirable to provide a layer of solder directly on the conductor which will then accept the solder ball (or a metal lead if desired) to form the final coupling. Such a layer may also be re-flowed to form a solder ball itself, under some conditions, eliminating the need for a complimentary solder ball on the component. This fine layer of solder is re-flowed as part of the connection process, which, if a solder ball is used, may also involve flowing of the ball's solder. Such ball re-flow will not occur should the melting point of the component ball's solder be higher than that of the solder layer, as is also often the case. When forming such solder layers (quantities of solder) on selected conductors, it is often necessary to protect other conductors which are not designated to have such solder thereon, at least not at this point in the procedure. Such other conductors, for example, may be intended to receive the aforementioned wire-bond connections, and, as a result, may include different external metallurgies than the solder conductors. Exposure of such other conductors may thus upset the metallurgies thereof as a result of exposure to hot solder or, as sometimes used, hot air, directed onto such exposed conductors. Should such metallurgies include precious metals such as gold, it is understood that damage to the metals can prove costly as well as time consuming (to repair the surfaces and provide same with the proper mix).

It is thus appreciated that in the manufacture of circuitized substrates such as those defined above, it is essential to avoid the pitfalls above, especially when producing such products having highly dense circuit patterns. As defined herein, the present invention is able to overcome such pitfalls, while producing a final substrate with highly dense patterns of conductors and lines. It is particularly noteworthy that the process as defined herein is able to do so while providing at least some pads with solder thereon and other pads excluding solder and thus adapted for other forms of connection. This process thus serves to protect the pads not having solder during the solder processing, and thus eliminate the costly and time consuming requirements to repair damaged pads or even replace the entire substrate, if necessary.

The following patents mention various processes for forming circuitized substrates. The citation thereof is not an admission that any are prior art to the presently claimed invention.

In U.S. Pat. No. 7,169,313, issued Jan. 30, 2007, there is defined a method of plating a circuit pattern on a substrate to produce a circuitized substrate (e.g., a printed circuit board) in which a dual step metallurgy application process is used in combination with a dual step photo-resist removal process. Thru-holes are also possible, albeit not required. This patent is assigned to the same Assignee as the present invention.

In U.S. Pat. No. 7,087,441, issued Aug. 8, 2006, there is defined a method of making a circuitized substrate in which two solder deposits, either of the same or different metallurgies, are formed on at least two different metal or metal alloy conductors and PTHs. In an alternative embodiment, the same solder compositions may be deposited on conductor and PTHs of different metal or metal alloy composition. In each embodiment, a single commoning layer (e.g., copper) is used, being partially removed following the first deposition. The solder is deposited using an electro-plating process (electroless or electrolytic) and the commoning bar in both depositing steps. This patent is also assigned to the same Assignee as the present invention.

In U.S. Pat. No. 6,547,974, issued Apr. 15, 2003, there is described producing a PCB using a process which includes patterning a photo-resist layer according to a circuit mask that defines desired circuit paths. The photo-resist pattern layer is formed by removing the photo-resist from the board in the desired circuit paths and a conductive material is plated onto the board in the voids defined by the circuit mask so that the height of the conductive material relative to the substrate equals or exceeds the height of the photo-resist layer relative to the substrate. A low-reactive solution is applied over the conductive material and removes a surface portion thereof. As the solution removes the conductive layer, it forms a film barrier and the solution composition changes, both of which substantially inhibit any further removal of the conductive material. Next, the film barrier is removed from the board allowing another film barrier to form stimulating the removal of further conductive material. The removal step is repeated until the conductive material is at a desired height relative to the height of the resist layer. The board is then finished using conventional circuit board fabrication techniques.

In U.S. Pat. No. 5,502,893, issued Apr. 2, 1996, there is described a PCB manufacturing method in which an organic non-conductive layer does not separate from the PCB's "metal core" (e.g., of aluminum) even in an environment of high temperature and high humidity since both the metal core and the organic non-conductive layer are firmly adhered. An organic non-conductive layer is formed over the metal core with a metal plated layer (e.g., nickel) there-between for protecting the metal core. A metal oxide layer is also used for enhancing adhesive force. By utilizing such a metal oxide layer, it is possible to more effectively prevent the organic non-conductive layer from separating from the plated layer (and thus the metal core). Further, the protecting metal plated layer can protect the metal core from erosion caused by contact with a strong alkali solution, etc. as may be used in a process of forming the metal oxide layer. Still further, copper plating inside the through hole can be performed easily.

In U.S. Pat. No. 5,494,781, issued Feb. 27, 1996, there is described a method for manufacturing a PCB in which there is formed on a top surface of an insulating substrate a layer of plating ground layer as a metal film, irradiating using electromagnetic waves such as provided by a laser, a boundary edge zone of what are referred to as "non-circuit parts" with respect to circuit-printing parts on the insulating substrate in correspondence to a pattern of the non-circuit parts to remove the plating ground layer at the part irradiated by the electromagnetic waves, and thereafter to form a plating on the surface of the plating ground layer at the non-irradiated parts. The apparent result is that the laser irradiation is carried out only with respect to the boundary edge zone of the non-circuit parts, without irradiating all of the non-circuit parts.

In U.S. Pat. No. 5,468,409, issued Nov. 21, 1995, there is described an etching solution for precision etching of vapor-deposited copper films of complex curvature on PCBs. Cupric chloride, sodium chloride and de-ionized water are constituents of the etching solution, which the authors claim are able to produce circuit lines of about three to ten mils.

In U.S. Pat. No. 5,358,622, issued Oct. 25, 1994, there is described a procedure for producing PCBs with pads for insertion of surface-mount devices (called SMDs by the authors). A copper lined base plate is provided with a positive photo-protective layer with a coating thickness lesser or equal to the depth of the pads to be built up for the connection of the SMD components. The positive photo-protective layer is exposed using a primary film with a window mask corresponding to the desired pad arrangement, and the exposed base plate is developed in a developing bath such that the photo-protective layer is removed in the area of the exposed windows, exposing open copper areas. The base plate developed in this way is exposed with a secondary film using a mask for the strip conductors, whereby the strip conductors are modeled as opaque areas. The twice-exposed base plate is electroplated in a tin or tin-lead bath, whereby a tin or tin-lead coating is built up in the region of the open copper area until the pads have been formed by this means with a depth greater or equal to the thickness of the photo-protective layer. The electroplated base plate is developed in a developing bath, whereby the tin plated pad areas and the protective layer regions covered by the opaque strip conductor areas of the secondary film remain. The base plate developed in this way is etched, whereby the laid-open copper areas are removed and the protective lacquer existing in the strip conductor areas is removed, laying bare the copper strip conductor areas.

In U.S. Pat. No. 5,338,645, issued Aug. 16, 1994, PCBs with three-dimensional surfaces are disclosed. Using a first technique, a three dimensional surface is formed on a substrate having a high melting point or permitting a high degree of infrared energy transmittance. The surface contains a layer of metallization maintained at a depth of less than two microns. An infrared laser then moves around the surface and selectively vaporizes the metallization, leaving a desired printed circuit pattern. The remaining metallization is plated to a useable depth. Using a second technique, a fiber optic bundle is machined on one end to mate with the three dimensional surface. The three dimensional surface, metallized and coated with photo-resist, resides in intimate contact with this first end. A second end of the cable is flat and resides in intimate contact with two-dimensional master photo artwork. A pattern is exposed on the photo-resist through the fiber optic bundle, and the metallization is etched using conventional techniques.

In U.S. Pat. No. 5,308,796, issued May 3, 1994, there is described a deposition process which involves formation of a silicide, such as palladium silicide, in the region upon which copper deposition is desired. The silicide acts as a catalyst to initiate reduction of copper ions from an electro-less plating bath to produce an acceptably low resistance copper deposition. Thus, for example, in the case of producing an interconnect involving a silicon region at the bottom of the interconnect structure defined through a silicon dioxide region, palladium is first evaporated over the entire surface and is heated to form palladium silicide only at the base of the structure. The palladium on the silicon dioxide surface is un-reacted. A selective etch is then used to remove the unreacted surface palladium. Upon substrate immersion in a conventional electro-less copper plating bath, copper deposition proceeds selectively on the palladium silicide surfaces and continues up through the interconnect. The silicon dioxide surface is non-catalytic to the plating step and induces essentially no copper deposition.

In U.S. Pat. No. 5,160,579, issued Nov. 3, 1992, there is described a process in which the areas of a PCB where electrical components are to be solder connected, such as thru-holes, surrounding pads and surface mount areas, are selectively provided with a metal coating (e.g., tin-lead) which preserves and promotes solderability at these locations, by a process in which a photo-imageable electro-phoretically deposited organic resin is used to provide, on an already patterned surface, an additional resist pattern which selectively exposes areas on which the solderable metal coating is to be provided and in which the resist serves also as an etch resist for metal areas over which it is arranged.

In U.S. Pat. No. 5,118,385, issued Jun. 2, 1992, there is described a method for making a multilayered electrical interconnect on substrates such as PCBs in which the inter-connect structure includes stacked pillars between layers, the method using a minimal number of conventional process steps. The method includes sputtering a chromium/copper/titanium tri-layer onto a dielectric base, depositing a patterned mask on the tri-layer, etching the exposed tri-layer, removing the mask, depositing a layer of polyimide over the un-etched copper, forming a via in the polyimide above the copper, plating nickel into the via using electro-less plating, and polishing the inter-connect to form a planar top surface.

In U.S. Pat. No. 5,084,071, issued Jan. 28, 1992, there is described a method of chemical mechanical polishing an electronic component substrate including the steps of obtaining an article having at least two features thereon or therein which have a different etch rate with respect to a particular etchant; contacting the article with a polishing pad while contacting the substrate with a slurry containing the etchant wherein the slurry includes abrasive particles (which do not include alumina), a transition metal chelated salt, a solvent for the salt, and a small but effective amount of alumina. The polishing causes the two features to be substantially coplanar.

In U.S. Pat. No. 4,775,611, issued Oct. 4, 1988, there is described forming high density primary wiring patterns on PCBs with less than 0.005 inch spacings and wiring conductor widths, which claim to permit wider conductors of at least three times the wiring spacing and which are thus less likely to have open circuit or substrate adherence defects. This is achieved by depositing on an irregular surface of a conventional "flat" panel insulator a thick liquid photopolymer layer of paste-like consistency, such as to a 0.006 inch thickness, flattening it with the image bearing side of a glass plate photo-transparency to produce high resolution wiring patterns comprising ridge tops defining insulating spacing between channel conductor areas there-between by means of un-collimated actinic radiation, forming thin conductive layers 0.0014 inch thick on the channel bottoms and sidewalls to produce wider conductors, and sanding off the flat ridge tops to assure that there are no short circuits between adjacent conductors.

In U.S. Pat. No. 4,702,792, issued Oct. 27, 1987, there is described a method of forming fine conductive lines, patterns, and connectors on a substrate, particularly those useful for electronic devices. The method comprises a series of steps in which a polymeric material is applied to the substrate, the polymeric material patterned to form openings through, spaces within, or combinations thereof in the polymeric material, a conductive material is applied to the patterned polymeric material, so that it at least fills the openings and spaces existing in the polymeric material, with excess conductive material removed from the exterior major surface of the polymeric material using chemical-mechanical polishing to expose at least the exterior major surface of the polymeric material. The structure remaining has a planar exterior surface, wherein the conductive material filling the openings and spaces in the patterned polymeric material becomes features such as fine lines, patterns, and connectors which are surrounded by the polymeric material. The polymeric material may be left in place as an insulator or removed, leaving the conductive features on the substrate.

As mentioned above, the present invention provides a new and unique process for producing circuitized substrates in which selected ones of the conductors thereon include solder while others are protected during the solder process and thus able to provide another means of connection, e.g., using fine wiring associated with wire-bond processing. The method taught herein overcomes the pitfalls cited above for many other processes, and may be conducted at comparative and sometimes relatively lower costs than such processes. It is believed that such a process will constitute a significant advancement in the art.

OBJECTS AND SUMMARY OF THE INVENTION

It is, therefore, a primary object of the invention to enhance the art of circuitized substrate manufacture in which external conductors are formed on the substrates and adapted for having electrical connections formed thereon.

It is another object of the invention to provide such a method in which selected ones of the conductors will include solder while others may not and thus be used to form different types of connections (e.g., wire-bond).

It is still another object of the invention to provide such a process which can be carried out in a relatively expeditious manner using many conventional processes and materials.

According to one embodiment of the invention, there is provided a method of making a circuitized substrate comprising providing a substrate including at least one dielectric layer having an external surface and a first plurality of conductors and a second plurality of conductors on this external surface, applying a photo-resist covering over the first plurality of conductors but not over the second plurality of conductors, applying a layer of solder-resist material over the photo-resist covering, exposing the first plurality of conductors having photo-resist thereon and the layer of solder-resist material on the photo-resist and the second plurality of conductors not having the photo-resist covering thereon to a quantity of molten solder so as to deposit the solder onto only the second plurality of conductors, and thereafter removing the layer of solder-resist material on the photo-resist covering and the photo-resist covering.

According to another embodiment of the invention, there is provided a method of making a circuitized substrate comprising providing a substrate including at least one dielectric layer having an external surface and a first plurality of conductors and a second plurality of conductors on the external surface, applying a photo-resist covering over the second plurality of conductors but not over the first plurality of conductors, depositing a conductive layer over the first plurality of conductors but not over the second plurality of conductors having the photo-resist covering thereon, removing the photo-resist covering over the second plurality of conductors, and thereafter selectively depositing solder onto only the second plurality of conductors.

BEST MODE FOR CARRYING OUT THE INVENTION

Figure 1:
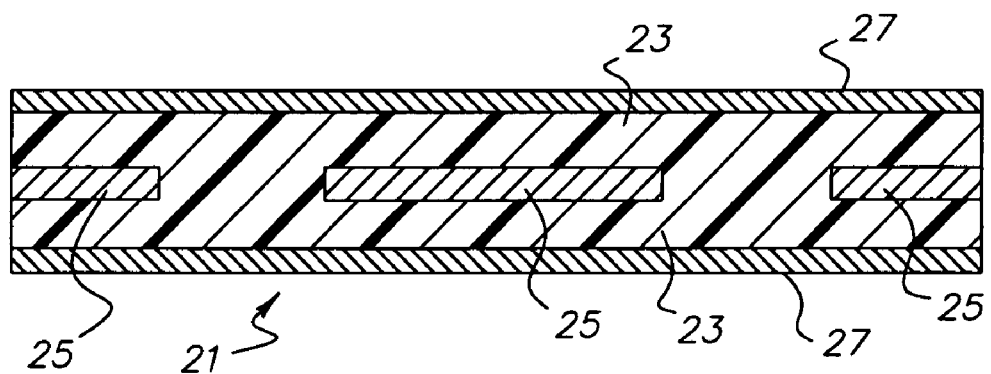
FIGS. 1-12 illustrate the various steps of making a circuitized substrate according to one embodiment of the invention.

For a better understanding of the present invention, together with other and further objects, advantages and capabilities thereof, reference is made to the following disclosure and appended claims in connection with the above-described drawings. Like numerals will be used from FIG. to FIG. to reference similar elements.

By the term "circuitized substrate" as used herein is meant to include substrates having at least one dielectric layer and at least one external metallurgical conductive layer. Examples include structures made of dielectric materials such as fiberglass-reinforced epoxy resins (some referred to as "FR-4" dielectric materials in the art), polytetrafluoroethylene (Teflon), polyimides, polyamides, cyanate resins, polyphenylene ether resins, photoimageable materials, and other like materials. The external (and internal if also used) conductive layer (s) are each a metal layer (e.g., power, signal and/or ground) comprised of conductors (and typically lines or traces) of suitable metallurgical materials such as copper or copper alloy, but which may also include additional metals such as nickel and/or gold. Such external layers will typically include a plurality of such individual conductors (or pads) of such metallurgy(ies), and, as defined, some pads will include solder while others will not. If the dielectric materials for the structure are of a photoimageable material, it is photoimaged or photopatterned, and developed to reveal the desired circuit pattern, including the desired opening(s) as defined herein, if required. The dielectric material may be curtain-coated or screen-applied, or it may be supplied as dry film. Final cure of the photoimageable material provides a toughened base of dielectric on which the desired electrical circuitry is formed. An example of a specific photoimageable dielectric composition includes a solids content of from about 86.5 to about 89%, such solids comprising: about 27.44% PKHC, a phenoxy resin; 41.16% of Epirez 5183, a tetrabromobisphenol A; 22.88% of Epirez SU-8, an octafunctional epoxy bisphenol A formaldehyde novolac resin; 4.85% UVE 1014 photoinitiator; 0.07% ethylviolet dye; 0.03% FC 430, a fluorinated polyether nonionic surfactant from the Minnesota Mining and Manufacturing (3M) Company; 3.85% Aerosil 380, an amorphous silicon dioxide from Degussa Corporation, having a business location at 379 Interpace Parkway, Parsippany, N.J. to provide the solid content. A solvent is present from about 11 to about 13.5% of the total photoimageable dielectric composition. The dielectric layers taught herein may be typically about 2 mils to about 4 mils thick, but also thicker if desired. Examples of circuitized substrates include printed circuit boards (or cards), hereinafter referred to also as PCBs, and chip carriers. It is believed that the teachings of the instant invention are also applicable to what are known as "flex" circuits (which use dielectric materials such as polyimide).

By the term "photo-resist" (or, more simply "resist") as used herein is meant a polymeric coating material that is designed to change properties upon exposure to light. Either the exposed or unexposed regions of such coatings can then be selectively removed to reveal the substrate beneath. Such materials are able to resist (hence the name) chemical reactions associated with circuit formation but are unable to resist the high temperatures associated with molten solders and would thus be severely damaged (including removal) if so exposed. These resists may be available in either liquid or dry film form, from suppliers such as Shipley Co (Rohm & Haas), Electra Polymers and Chemicals, AZ Electronic Materials, Arch Chemicals, JSR Microelectronic, Cookson Electronic Materials, Huntsman Advanced Materials, Sumitomo, Taiyo, E.I. du Pont de Nemours and Company, MacDermid Imaging Technology, Hitachi, Eternal Chemical, Kolon Scena and Hoechst. Such companies are well known in the industry and provision of the addresses thereof is not necessary.

By the term "solder-resist" as used here is meant to define a material able to protect circuitry and other parts of a substrate during the application of solder, including when the solder is applied in molten form (e.g., dipping the substrate within a molten solder "bath"). Such materials are comprised of resin formulations, permanent in nature, and generally green in color. These serve to encapsulate and protect the designated surface features of a substrate (except the specific areas where it is required to form solder joints), thereby preventing wetting by molten solder of all but those areas during assembly, while thereafter providing electrical insulation and protection against oxidation and corrosion. One method of creating the solder resist image is by stencil printing with a silk screen, but this technique often cannot achieve the precision of registration and resolution demanded by fine-pitch surface-mount designs; hence, liquid photo-imageable solder resist is now widely used in the industry for such high density features. These materials are available from many sources, including NEC, Tamura Kaken Corporation and Coates Circuits Products, to name a few. Because such companies are also well known in the industry, provision of the addresses thereof is also not deemed necessary.

As understood from the following, the present invention defines a new and unique method of providing circuitization on a substrate in which a resulting pattern of high resolution is possible. As part of this method, selected ones of the resulting conductors (pads) of the circuitry are protected during solder application onto other conductors such that the protected conductors may then be adapted for providing other forms of connection (e.g., wire-bond) compared to those with solder. Surprisingly, it has been learned that such protection may be possible using photo-resist material with a covering of solder-resist to assure that solder applied to the exposed and non-protected conductors does not intrude under the protection and contact the protected conductors. The method is possible without the use of sophisticated and thus expensive equipment other than what is conventionally used in substrate (especially PCB) manufacturing. It is thus attainable in a facile manner and at relatively low costs, compared to many processes known in the art.

Figure 2:
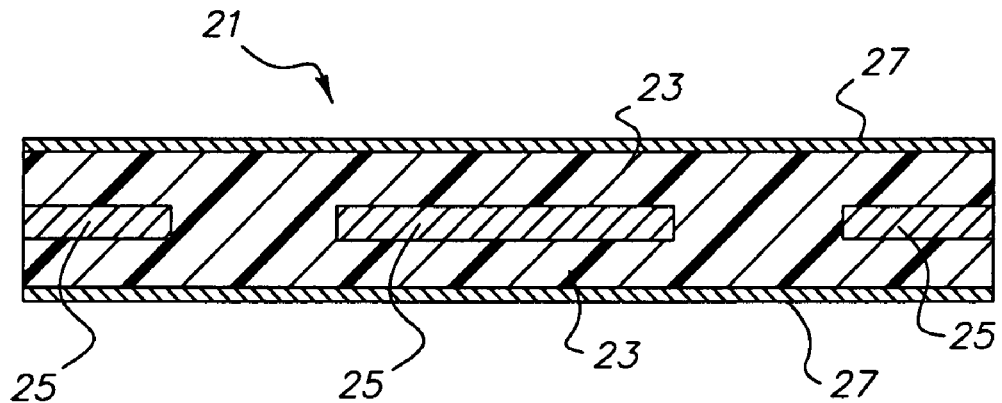

To achieve the above, the method starts with the provision of a suitable dielectric substrate, preferably of one of the above mentioned dielectric materials (e.g., the defined epoxy resin "FR4" material). In one example, a substrate having a thickness of 100 mils is provided (a mil being 0.001 inch). In a preferred embodiment, as shown in FIG. 1, a substrate 21 is shown which includes at least one dielectric layer 23. In a most preferred embodiment, substrate 21 includes at least two dielectric layers 23 with an interim conductive layer 25 (preferably copper) therein. Although three sections are shown for layer 25, it is understood this is one continuous layer and that the open portions therein are preferably holes, such as "clearance" holes if layer 25 is to serve as a power or ground layer in the final product. Alternatively, interim layer 25 may be a signal layer which will be eventually electrically coupled to other conductive parts of the final structure. A copper "foil" (layer) 27 having an initial thickness of 0.7 mils is bonded to the substrate, preferably using a known PCB lamination process. In a preferred embodiment, the copper foil 27 is laminated on opposite sides of substrate 21, as shown. These layers 27 are each then "thinned" (FIG. 2) to a thickness of about 0.20 mils, using a chemical polishing method described in the aforementioned U.S. Pat. No. 6,547,974. In such a method, fluid treatment devices manufactured by the Assignee of the invention may be used, such devices providing precise spraying of desired chemicals (e.g., etchants) for the appropriate time and at established pressures. Other means of such "thinning" are possible and the invention is not limited to such spray devices. The purpose of the thinning of the copper layer is to reduce the overall copper thickness for subsequent processing, defined below, thereby reducing etch "overhang" and "under-cut" of the copper.

Figure 3:
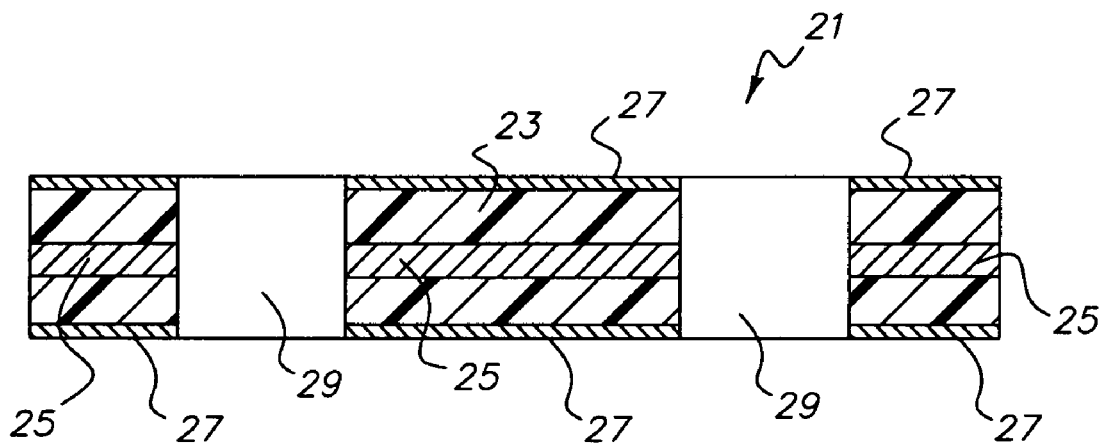

The formed circuitized substrate produced using the teachings herein will preferably include thru-holes of one or more of the types defined above (e.g., entirely through the substrate or to a "blind" depth within the substrate from one surface) as part thereof, such holes (openings) represented by the numerals 29 in FIG. 3. These holes are formed within the now multi-layered composite preferably using either a mechanical drilling procedure or a laser (most preferred). If the holes are formed using laser ablation, such formation is known in the art. In one such method, an ultraviolet Nd:YAG laser may be used. Additionally, a $CO^2$ or Excimer laser may also be used. In one example, each of the openings or holes 29 is provided within the substrate with a diameter within the range of from about 2.0 mils (if using a laser) to about 250 mils (if using mechanical drills). In one example, a total of about 5,000 holes may be provided per square inch of the substrate, although other numbers are readily possible. This extremely close patterning of thru-holes represents one example of the high circuit densities attainable using the teachings of the instant invention.

Figure 4:
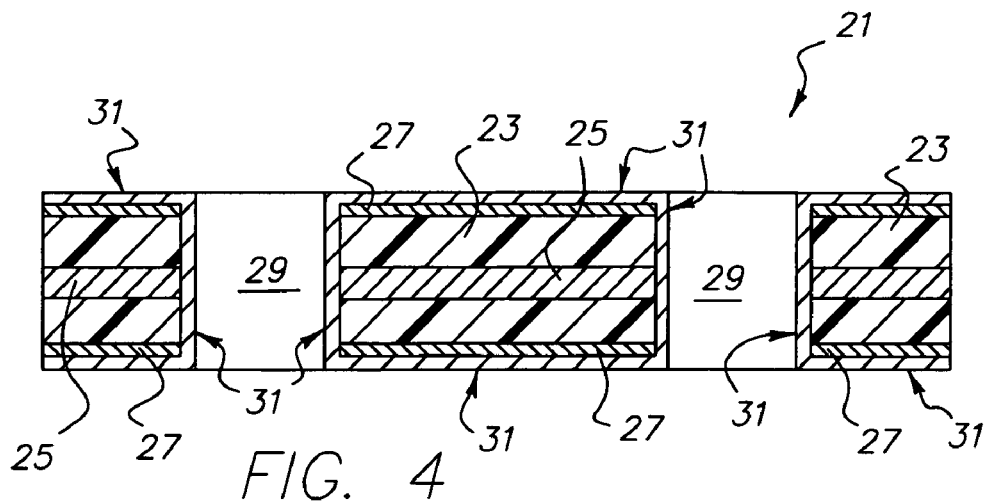

In the next step of the invention, metallization is accomplished over the remaining copper layer 27 on the supporting substrate, and within the formed holes 29. (Note that the metal of layer 27 does not extend within the bare walled holes 29.) A preferred means of achieving this is to use electrolytic plating, in which electro-less plating is used to form a base or "seed" layer, following which a second, copper layer is applied, preferably using electrolytic plating. Both of these layers are shown as one layer 31 in FIG. 4 for ease of illustration purposes. The "seed" layer in one embodiment has a thickness of as thin as 0.5 microns up to two microns while the subsequently applied layer has a thickness of approximately 1.0 mil. A preferred method of achieving this is periodic reverse pulse acid copper plating at amperages within the range of about ten to twenty-five amperes per square foot. Forward to reverse current density ratios of up to about 1:3 may be utilized. The seed layer with Cu layer thereon thus covers all of the exposed surfaces of substrate 21, including those of the internal holes 29.

The exposed metallurgy on the substrate may now be subjected to a chemical treatment process. One preferred process involves exposing the copper metallurgy to what is referred to as a "BondFilm" solution currently available on the marketplace under this name from Atotech Deutschland GmbH, an international company having a U.S.A. business address at 1750 Overview Drive, Rock Hill, S.C. BondFilm solution is comprised primarily of three components: (1) sulfuric acid; (2) hydrogen peroxide; and (3) copper, as well as additional Atotech Deutschland GmbH proprietary constituents. This process is also referred to as an oxide alternative process, meaning that it does not result in the formation of oxide layers on the treated material. By way of example, the RMS roughness values for the exposed copper may now be raised slightly to from about 0.15 microns to about 0.6 microns with a peak of about 1.2 to about 2.2 microns. The BondFilm process involves exposing the copper to this solution for a period of from about fifteen to about twenty seconds at a solution temperature of about 20 to 35 degrees Celsius (C.). As part of this treatment, the copper's external surfaces are cleaned and degreased, following which a micro-etch of the surfaces occurs. Finally, a very thin organic coating (not shown) is applied to these surfaces. Such a thin coating is also referred to as a "conversion" coating. In one example, this thin organic coating is primarily comprised of benzotriazole and possesses a thickness of from only about 50 Angstroms to about 500 Angstroms. This process, although optional, is desired to further promote subsequent photo-resist adhesion.

Figure 5:
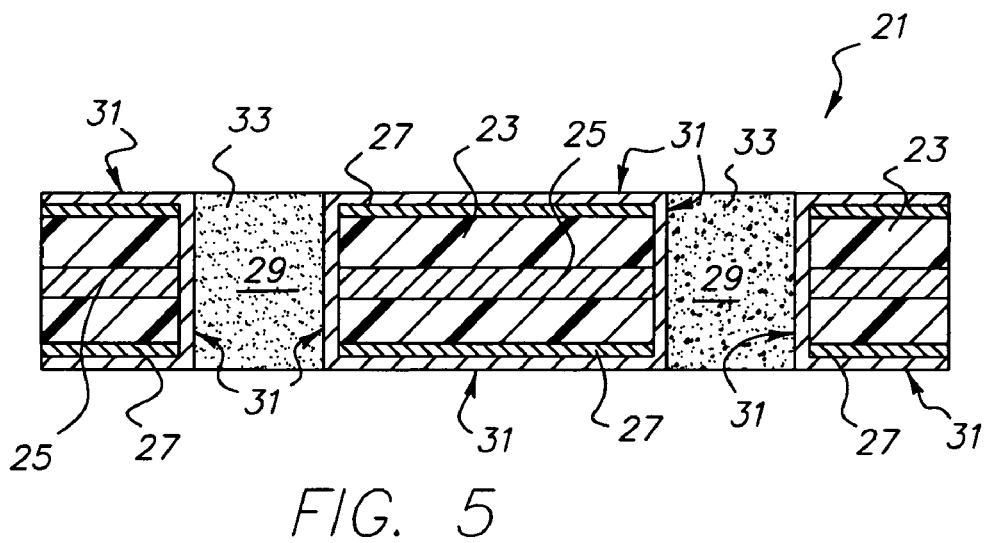
Figure 6:
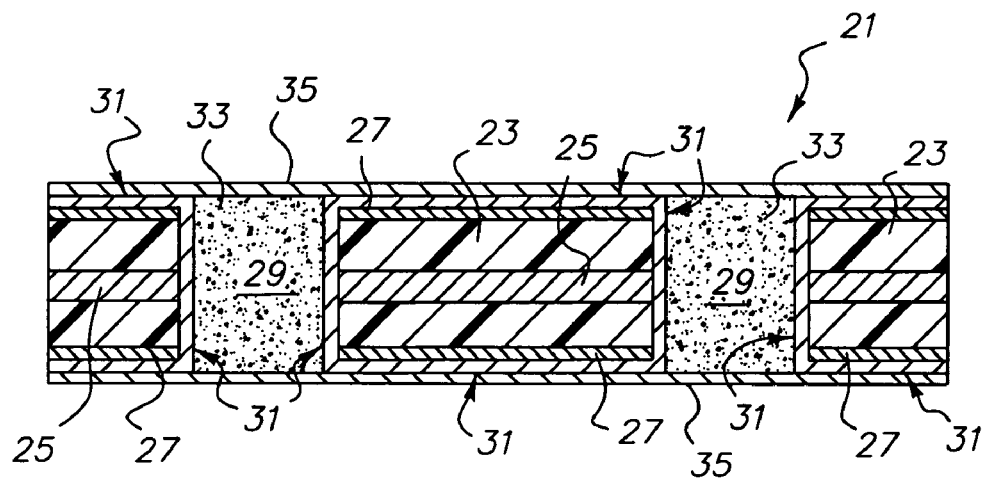

In FIG. 5, holes 29, including having the defined external conductive layer(s) 31 thereon, are now filled with a paste 33. Paste 33 may be conductive or non-conductive, depending on operational requirements. One example of a suitable conductive paste is CB100, available from E. I. du Pont de Nemours and Company, mentioned above. One example of a non-conductive paste suitable for use in the invention is a particulate filled Driclad material, available from the Assignee, Endicott Interconnect Technologies, Inc. (Driclad is a registered trademark of Endicott Interconnect Technologies, Inc. for its well known dielectric material used in many substrates, including PCBs and chip carriers). Paste 33 is provided using a conventional paste dispenser (not shown) and then hardened, e.g., through application of heat, as is known in the substrate manufacturing art. Further description is not considered necessary. Following such hardening (cure) of the paste, the substrate of FIG. 5 is now subjected to a planarizing process, such as defined above, to assure substantially smooth outer surfaces for the substrate, including, significantly, over the exposed paste surfaces. As stated above, such planarizing may be achieved using mechanical or chemical processing.

Significantly, paste 33 serves as a support for a subsequent conductive layer 35 formed there-over, as well as on the remaining portions of both the upper and lower surfaces of substrate 21. Layer 35 is preferably copper or copper alloy and is plated using electrolytic or electro-less plating, and in one example, possesses a thickness of about 0.0001 to about 0.0005 inch. This plating, known also as "cap plating", thus occurs directly onto the exposed outer surfaces of the paste. Conductive layer 35 is thus located on each of the illustrated conductive thru-holes and extends across the entire outer surfaces of the substrate. Despite the differences in undersurfaces (the underlying copper and the underlying paste), uniformity of thickness for layer 35 is attained.

It is also within the scope of the invention to fill the holes 29 with material other than paste. For example, copper is possible and may be provided using one of the aforementioned plating operations to substantially completely fill each of the holes. The resulting solid (plug) structure will also include a substantially planar upper surface similar to the shown exterior surfaces of paste 33. Although copper is the preferred material for this alternative embodiment of the invention, other metals may also be utilized, including nickel (Ni), gold (Au), lead (Pb) and tin (Sn), as well as combinations thereof.

The next step of the invention involves the formation of desired first and second pluralities of conductors on the opposing surfaces of substrate 21. This is accomplished using a conventional photolithographic process known in the substrate art, particularly one used in making PCBs. Firstly, a suitable photo-resist material is provided over the outer surfaces. In one embodiment, a dry film photo-resist film from Morton Thiokol (having a business location at 110 North Wacker Drive, Chicago, Ill.) and sold under Morton's "5000 Series" of photo-resists is used. Alternatively, a liquid photo-resist material is possible. Thickness of the applied material depends in part on the desired line width and line spacings for the resulting circuit pattern. For example, if line width and line spacings of four mils each are required, a three mil thick photo-resist is possible, while if lines of widths and spacings of three mils are required, a thinner photo-resist having a thickness of only about two mils is possible. These examples represent the high density line patterns attainable using the teachings of this invention. Even greater densities are possible. The photo-resist layer covers all of the metallurgy on the upper and lower surfaces of substrate 21, as mentioned, but does not extend within holes 29, because of the covering layer 35 over paste 33. The adhesion of the photo-resist to the exposed upper and lower metallurgy is enhanced as a result of mechanical and/or chemical pretreatment steps which are commonly used in the industry.

Figure 7:
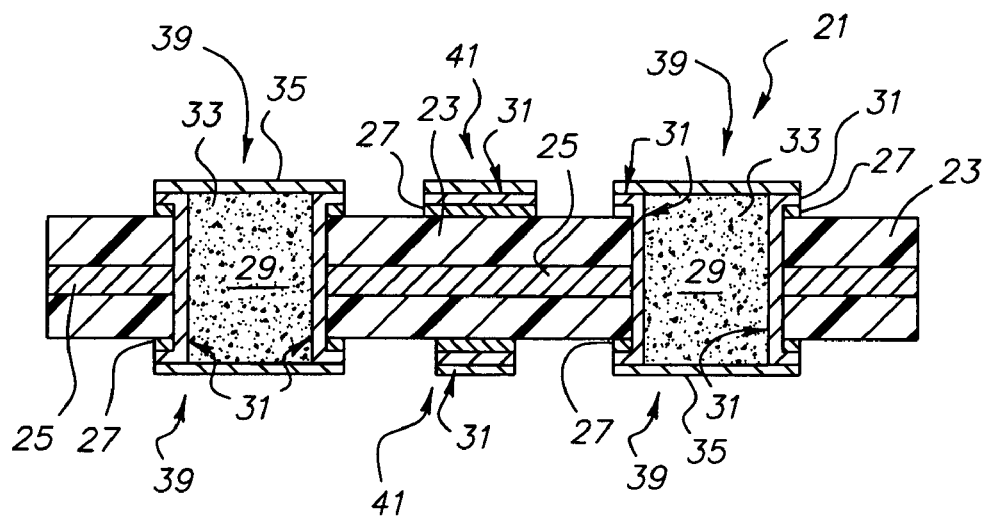

To produce the desired circuit pattern (to include upper and lower first and second pluralities of conductors, as shown in FIG. 7), a mask is next aligned over the photo-resist to define the underlying circuit pattern and exposure to actinic radiation occurs for a predetermined period. This processing may involve use of direct laser imaging, as well as conventional exposure using glass-film artwork. A vacuum is applied to assured mask adhesion to the photo-resist material during such processing. Further description of this known process is not considered necessary. As part of this known procedure, selected portions of the photo-resist are subsequently removed (using a known developer solution), as are parts of the metallurgy (layer 35), the latter using a conventional etching process (e.g., using the known etchant, cupric chloride). In one example, the metallurgy is sprayed with etchant at a pressure of about twenty to twenty-two pounds per square inch (hereinafter also PSI) during a first pass on a conveyor at a speed within the range of about thirty-five inches per minute to about fifty inches per minute, depending on the desired final thickness for the circuit pattern. Subsequent passes at higher speeds (e.g., eighty inches per minute) may be performed, with microscopic inspection occurring following each pass. The result of this photolithographic process is the formation of a pattern of conductors on both opposing surfaces, as clearly seen in FIG. 7, separated by open portions of the exposed upper substrate. These conductors will be referenced by the numbers 39 for those atop the filled thru-holes and 41 for those on the outer surfaces of substrate 21. Both conductors 39 and 41 will be of the same thickness, and are comprised of the covering metallurgy 35 and the underlying metallurgies 31 and 27. Conductors 41 may be signal lines and/or pads of various dimension, e.g., if signal lines, these may be longer from top to bottom depending on the needed connection lengths for same. Such conductors 41 may be connected to respective ones of the conductors 39, if desired. Spaces are clearly seen between all of the various conductors, at least in the view of FIG. 7.

The foregoing steps have been performed, for the most part, using conventional substrate processing processes and equipment.

Figure 8:
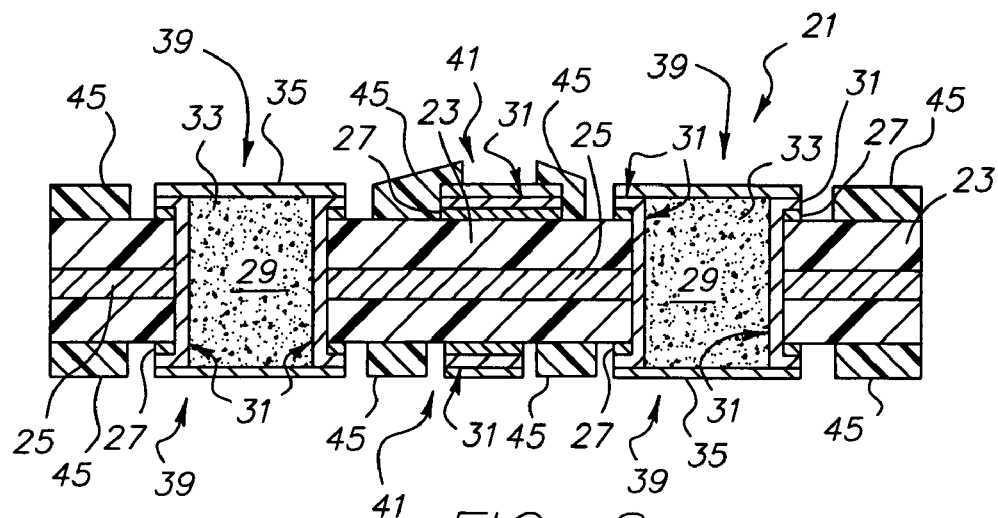

FIG. 8 involves the application of solder resist (or mask) material 45, which will remain in place on the substrate including after final processing. Accordingly, material 45 is considered permanent. Material 45 serves its intended purpose of protecting exposed areas which will not receive plating, the next step in the invention. Such plating, as defined below, may be of relatively expensive metals and thus the material serves to also prevent the waste of same.

Figure 9:
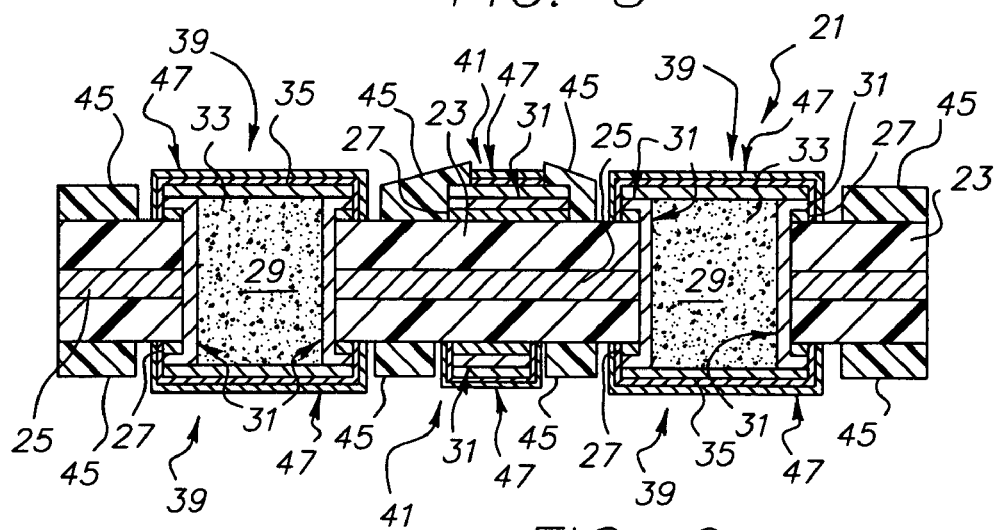

The next step, shown in FIG. 9, involves plating selected metallurgies onto the exposed surfaces of conductors 39 and 41. Electro-less plating is preferred, but other plating processes are acceptable. These coatings provide enhanced conductivity for any electrical connections being formed on the conductors, and, in the case of where solder is to be eventually used, some of the metallurgy, e.g., gold, if used, may "blend" in with the solder, forming a primarily tin-nickel (if nickel is also used) joint (the tin being taken from the solder, if a tin-lead solder or at least a solder containing tin). Both such layers are preferably applied over all exposed surfaces, but a single number 47 is used to represent this, because it is also within the scope of this invention to use but a single layer at this stage. It is also possible to provide more than two layers. Layer(s) 47 provide enhanced conductivity in the connections, as stated. In the above embodiment, a layer of a first non-precious metal (nickel, preferably) is deposited following which a thin "strike" of the precious metal (preferably gold) is deposited. In one example, a nickel layer having a thickness range of about 1.25 to about 8.0 microns is applied followed by a gold layer having a thickness of only about 0.05 to about 0.50 microns. For applications where a thicker gold is desired (e.g., where the circuitry is to engage connector leads or wirebonds, an additional 0.50 to 2.0 microns gold may be applied, including in both hard and subsequent soft form. In addition to nickel, other base metals such as cobalt may be used, while a metal other than gold, e.g., palladium, may be used.

Figure 10:
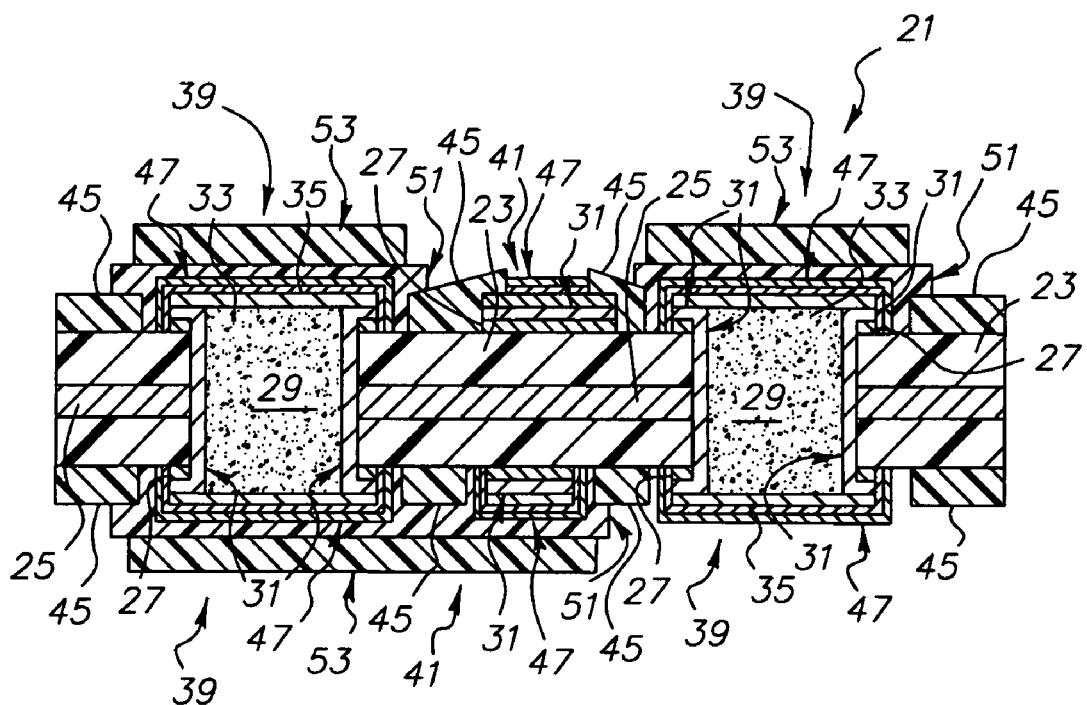

The next steps of the invention are deemed truly different and unique compared to previously known procedures used in manufacturing circuitized substrates. The procedures defined herein-below allow the formation of such a substrate in which the formed conductors may be used for forming different connections, while assuring protection for selected ones of the conductors during relatively harsh aspects of the processing. As seen in FIG. 10, a layer of photo-resist material 51 is applied, using a vacuum lamination process to assure a sound and conformal bonding to the designated surfaces. In one example, this vacuum lamination process is accomplished at a temperature within the range of from about 75 degrees Celsius to about 95 degrees Celsius and at a cycle time with the range of from about 60 to about 80 seconds. Conventional vacuum laminators may be used. It will be the primary purpose of the laminated photo-resist to protect the covered conductive surfaces in a very precise manner, to avoid the imposition of harsh materials such as solder where same are not desired. Such precise protection further serves to assure the high density of conductors as defined above. In FIG. 10, photo-resist material 51 covers three outer surfaces of the two thru-holes shown and, in the case of the lower conductors, extends over onto an adjacent signal line/pad conductor 41. Notably, it also fills openings between the conductors on the outer substrate surfaces. In one example, the photo-resist may have a thickness of from about 2.0 mils to about 4.0 mils. The thickness of this photo-resist depends on the corresponding height of the conductors being covered; that is, the greater the conductor height, the thicker the resist needs to be.

Following lamination of photo-resist material 51, sacrificial solder-resist material 53 is applied to cover, and thus protect, corresponding areas of the photo-resist, as also seen in FIG. 10. This is an important step in the invention, because the substrate is next to be subjected to a soldering operation, which, as is know, may be relatively harsh and thus potentially detrimental to some exposed surfaces of the substrate, especially the metallurgies defined above. In one example, the solder-resist may have a thickness of from about 6 mils to about 12 mils, when applied to a photo-resist layer having the above thickness. A preferred sacrificial solder-resist material is available from Lackwerke Peters GmbH+Co KG, under their product code "2950T", and is distributed in the United States by Electrochemicals Inc, having a business location at Pioneer Creek Drive, Maple Plain, Minn. This material is capable of being subsequently manually removed by peeling, which is one of the techniques of removing it in the present invention. Preferred application is by selective screen printing and then curing at a temperature within the range of about 120 degrees Celsius to about 150 degrees Celsius for a time period of from about ten to about twenty minutes. Other solder-resist materials, such as one available from Coates Circuit Products and distributed by Jam Technologies, 150 Bushnell Street, Buffalo, N.Y., under the Coates Circuit Products product code "XZ93-S", are possible, including those removed by means other than manual.

Figure 11:
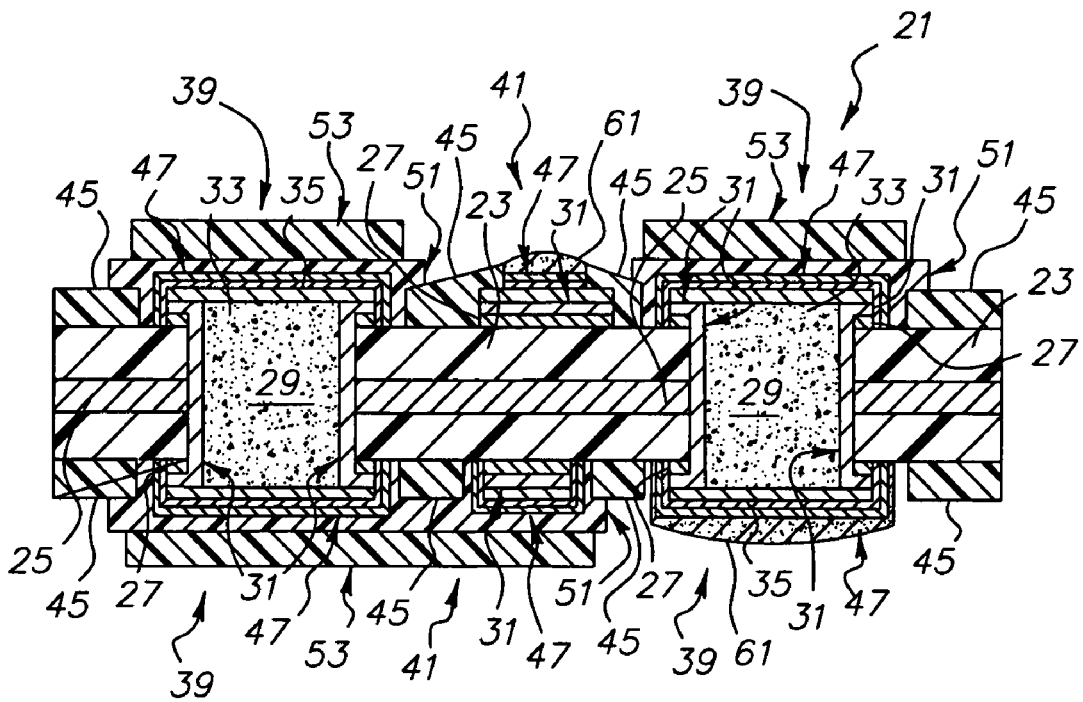

In FIG. 11, substrate 21 is subjected to a solder operation in which solder 61 is deposited onto the outer surfaces of two of the conductors, the thru-hole conductor 39 to the lower right and the center conductor 41 on the top surface. Again, it must be stated that various conductors may be formed using the teachings herein, and various patterns of same may be employed. The embodiment shown in FIG. 11 is not meant to limit the invention as such many other combinations are possible. It is also within the scope of the invention to provide solder onto different conductors than those shown, including, for example, onto all of the conductors 41 but not onto conductors 39, or vice-versa. The method illustrated and defined herein is taught as providing solder on both types shown, and thus representative of the versatility of this invention. Solder 61 is preferably provided using a hot air solder level (hereinafter, also HASL) procedure in which the substrate is immersed in a bath of molten solder (in one example, a solder having a composition of 37 percent by weight lead and 63 percent by weight tin) and then quickly withdrawn and passed between hot air nozzles which direct high pressure, hot air onto the solder (which remains in a molten stage at this point) to remove undesired, excess portions of the molten solder while leaving desired quantities (as shown). In one example, the substrate is immersed in the molten solder bath at 255 degrees Celsius for a brief time period of only about two to four seconds. The HASL process has found wide acceptance in the substrate industry for some substrate products and further definition is not considered needed. However, it is important to note that the high pressures created for the hot air has often resulted in molten solder (and possibly other undesirable elements) being blown under any protective coverings of solder-resist, which may form "bridges" or other undesirable conductive formations on the eventual circuit. Such solder exposure to the nickel and gold plated conductor surfaces may also adversely alter these metallurgies, such as the aforementioned "blending" of gold with the solder, which may not be desirable for this particular conductor coupling. The present invention is uniquely able to prevent such deleterious incursions by using a firmly fitting (laminated) photo-resist in addition to a protective sacrificial solder-resist covering. Surprisingly, the photo-resist is not harmed by the hot air and solder due to its solder-resist material covering. The photo-resist, being of finer resolution than the solder-resist, is thus able to provide more precise protection for the fine lines and/or pads of the substrate's circuitry, than might have been possible using simply a solder-resist. As stated, it is surprisingly able to do so during the high heat and pressures associated with the HASL process while remaining substantially intact.

Figure 12:
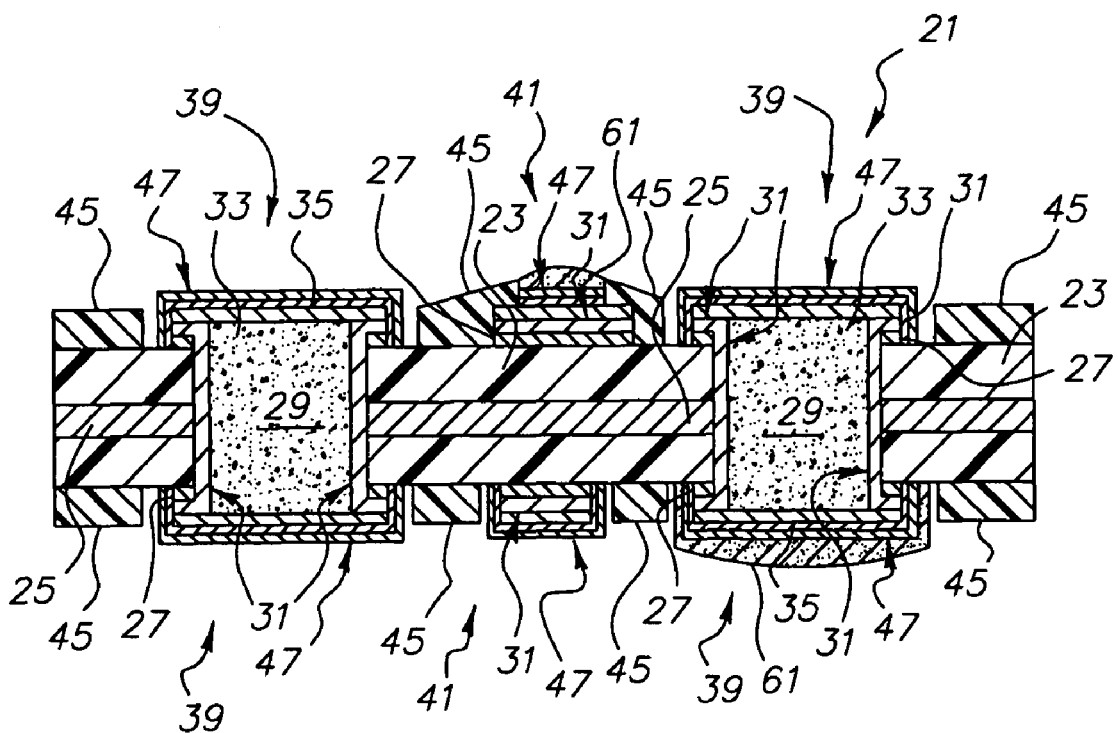

Following solder deposition, both of the photo-resist and solder-resist materials which were applied to protect the selected ones of the conductors on substrate 21 are now removed. As mentioned above, the solder-resist is preferably peeled away using manual means, but, as stated, other means may be used depending on the nature of the solder-resist material. This leaves only the photo-resist remaining. The preferred method to effect removal of the photo-resist is a chemical process in which the resist is exposed to an ozone friendly photo-resist stripper which, in one embodiment of the invention, was benzyl alcohol. This solvent is very desirable because it is compatible with both the gold and the tin-lead metallized features, as well as the desired remaining (and thus permanent) solder resist. Equally importantly, it also assures that all of the remaining photo-resist is removed. This process has effectively removed any remaining remnants of photo-resist material, as now seen in FIG. 12. Understandably, any remaining such material, even so slight, may have a serious adverse impact on the resulting substrate product, including possible electrical shorting of adjacent circuit lines. The method as taught herein substantially eliminates any such possibility.

The resulting substrate, having the circuit pattern formed thereon, is now adapted for functioning as a circuitized substrate (e.g., PCB or chip carrier). The conductors having solder already thereon may be used to accommodate a metal lead member or even another solder member (e.g., a solder ball) from an electronic component such as a chip, chip carrier, dual in-line package, or the like. The conductors not having solder may be used to accept fine wires such as those associated with wire-bond products, including chips. The exposed gold will thus form the desired enhanced connection to such wires. In the case of the solder 61 already provided, it may also form the defined tin-nickel or the like "joint" should the exposed gold blend or mix with the solder material, e.g., during a re-flow of the solder or the other solder ball being positioned thereon. Many different forms of couplings are thus possible using the unique teachings herein.

Figure 13:
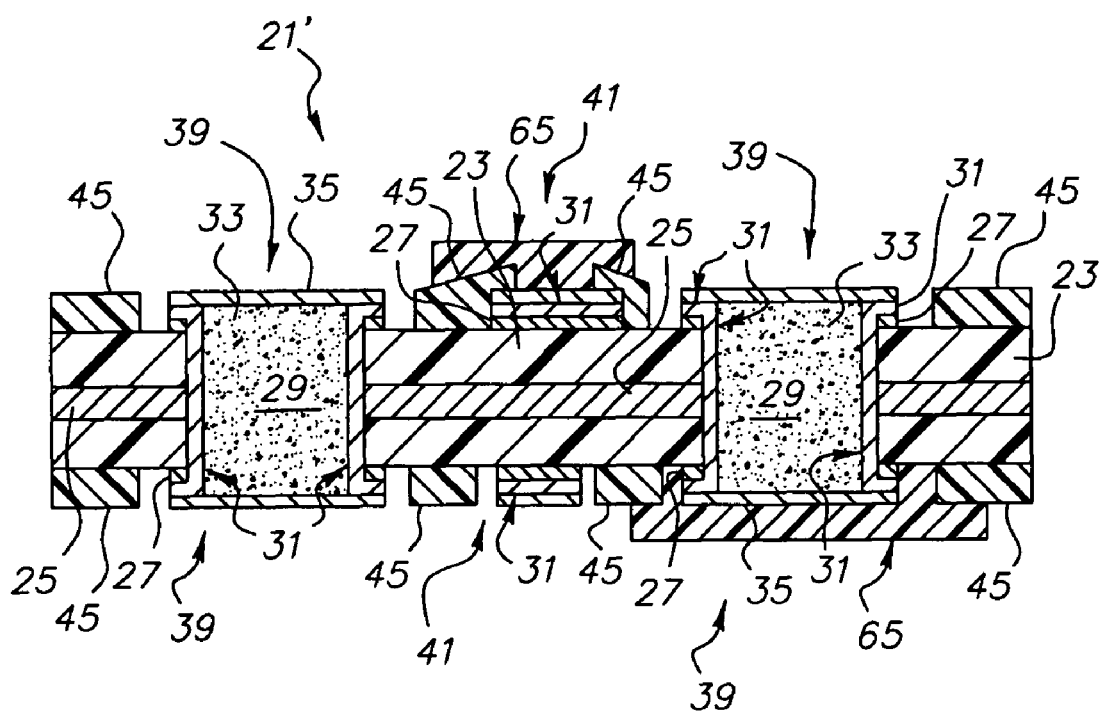
FIGS. 13-16 illustrate the remaining, various steps of making a circuitized substrate according to another embodiment of the invention.
Figure 14:
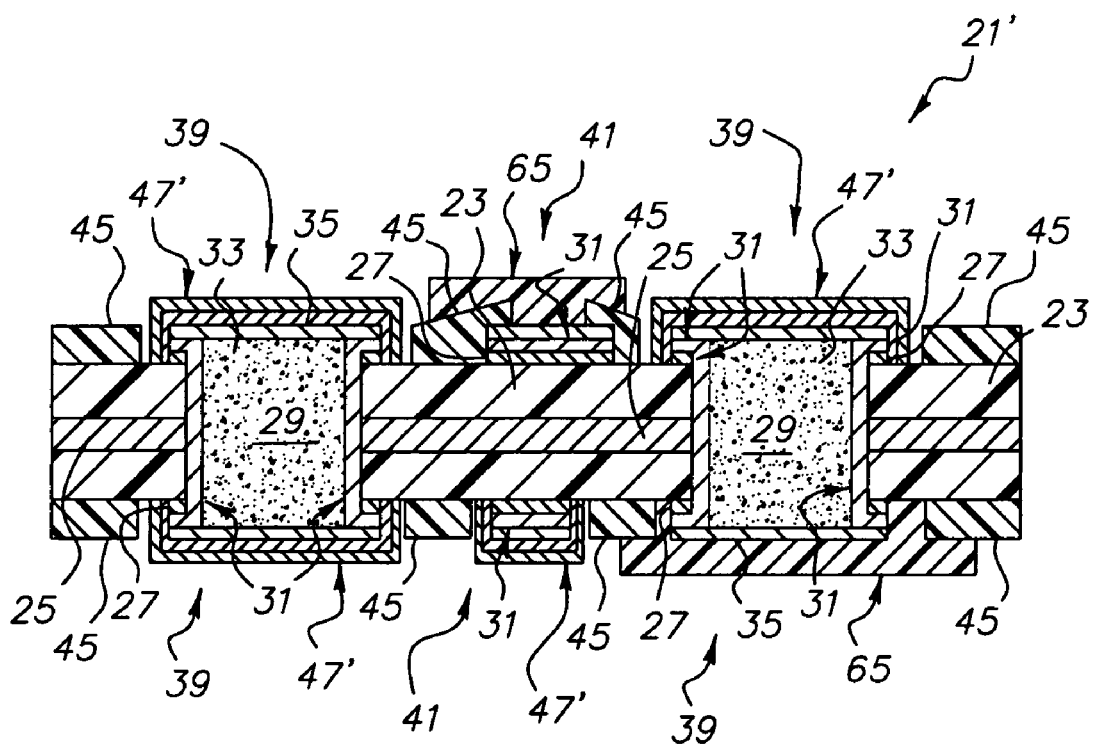

FIGS. 13-16 represent an alternative embodiment of the invention. The substrate (now referenced by the number 21') of FIG. 13 is substantially similar to that shown in FIG. 8, and has thus been subjected to similar processing as was the FIG. 8 substrate. In FIG. 13, a layer of photo-resist material 65 is applied, to cover two conductor surfaces as shown. Material 65 is preferably applied by vacuum lamination using similar parameters as used above for material 51. The same photo-resist material may also be used for this step in the invention. Following resist application, layer(s) 47', similar as the layer 47 to the extent that it uses two layers, a base of nickel and the outer of gold, is applied. Layer(s) 47' is different in that a third metal is applied, this being palladium, following the nickel deposition. Both nickel and palladium are preferably applied using electro-less plating as was used for the nickel and gold layers in the previous embodiment. However, the gold now applied is preferably applied by an immersion process in which the substrate is immersed in a suitable gold solution. The formed electro-less nickel and palladium followed by an immersion deposited gold form of conductor surface is deemed the equivalent (as good as) the afore-defined double electro-less nickel and gold conductor surface metallurgies. The invention is able to accomplish this without the defined harsh HASL process (see more below). This dual plating and the subsequent immersion processing, illustrated in FIG. 14, is a relatively "gentle" series of process and the laminated photo-resist 65, not including a covering layer of solder-resist or other material, alone prevents this metallurgy from forming on the protected surfaces.

Figure 15:
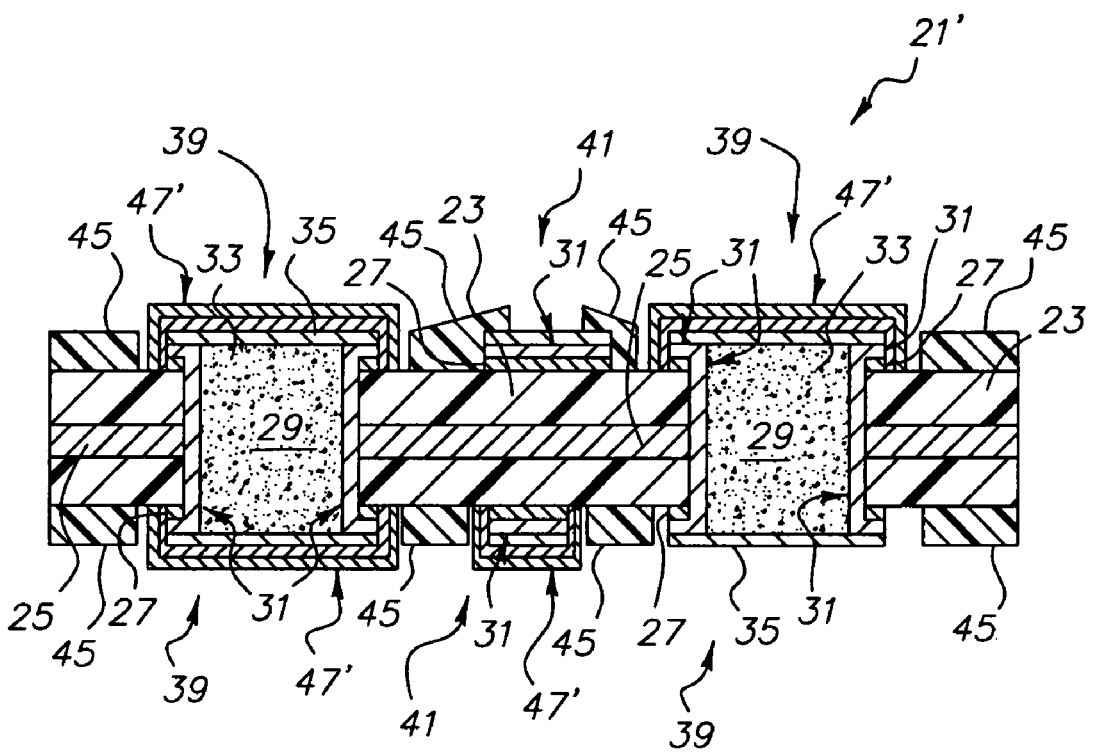
Figure 16:
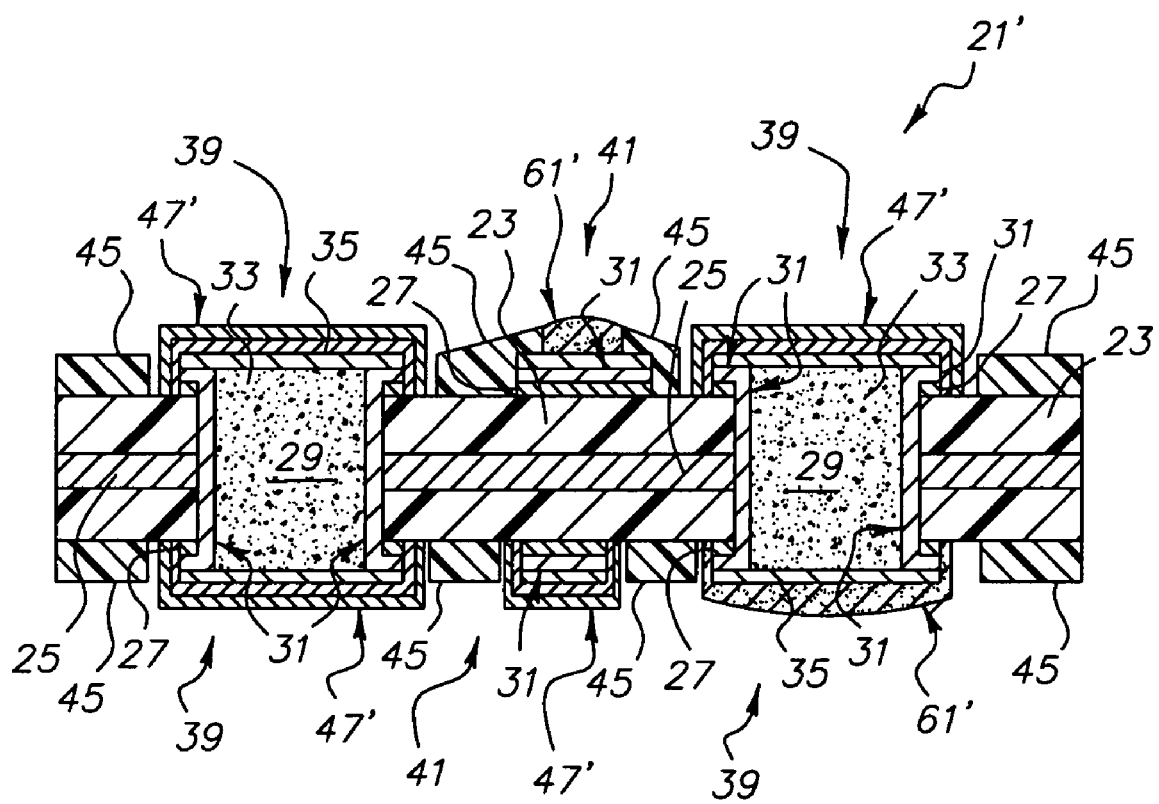

In FIG. 15, the photo-resist 65 has been removed, preferably using a similar process as used to remove photo-resist 51, and in FIG. 16, quantities of solder 61' are deposited onto the exposed surfaces of the middle conductor on the upper surface and the lower right conductor, both of the surfaces thereof previously having the protective photo-resist thereon. Solder 61' is preferably deposited using a screen printing procedure and not the above HASL process. The screen application, using conventional solder deposition screens, results in a deposit of solder onto the two exposed conductors as shown. The solder 61' is preferably of the same composition as solder 61, but may be of different composition. The result is practically the same as provided for substrate 21 in FIG. 12—at least two different conductors adapted for providing at least two different forms of connections to desired conductors such as leads, fine wiring (wire-bond) and/or solder elements, with at least one exception: solder 61' forms a copper-tin intermetallic joint which is stronger than the aforementioned nickel-tin joint. In the FIG. 13-16 embodiment, however, there is no need for solder-resist material application or removal.

There has thus been shown and defined manufacturing processes which result in a circuitized substrate having different conductors thereon, including on opposite surfaces of the substrate, if desired. The invention is capable of being performed using, for the most part, conventional equipment and methodologies, and thus assures a finished product which will not be significantly more expensive, if at all, compared to existing products. The method taught herein is capable of providing precise covering of fine lines and conductors (pads) and is thus adapted for high density circuit applications.

While there have been shown and described what at present are considered the preferred embodiments of the invention, it will be obvious to those skilled in the art that various changes and modifications may be made therein without departing from the scope of the invention as defined by the appended claims.

What is claimed is:
1. A method of making a circuitized substrate, said method comprising:
 providing a substrate including at least one dielectric layer having an external surface and a first plurality of conductors and a second plurality of conductors on said external surface;
 applying a photo-resist covering over said first plurality of conductors but not over said second plurality of conductors on said external surface of said substrate;

applying a layer of sacrificial solder-resist material over said photo-resist covering;

exposing said first plurality of conductors having said photo-resist covering and said layer of solder-resist material thereon and said second plurality of conductors not having said photo-resist covering thereon to a quantity of molten solder so as to deposit said solder onto only said second plurality of conductors; and thereafter removing said layer of solder-resist material on said photo-resist covering and said photo-resist covering over said first plurality of conductors.

2. The method of claim 1 wherein said applying of said photo-resist covering over said first plurality of conductors but not over said second plurality of conductors on said external surface of said substrate is accomplished using a lamination process.

3. The method of claim 2 wherein said lamination process is accomplished at a temperature within the range of from about 75 degrees Celsius to about 95 degrees Celsius for a time period of from about sixty to about eighty seconds.

4. The method of claim 1 wherein said applying said layer of sacrificial solder-resist material over said photo-resist covering is accomplished by selective screen printing and curing at a temperature within the range of from about 120 degrees Celsius to about 150 degrees Celsius for a time period of about ten to twenty minutes.

5. The method of claim 1 wherein said exposing said first plurality of conductors having said photo-resist covering and said layer of solder-resist material thereon and said second plurality of conductors not having said photo-resist covering thereon to said quantity of molten solder is accomplished by immersing said substrate within a bath of said solder.

6. The method of claim 1 wherein said removing said layer of solder-resist material on said photo-resist covering photo-resist and said removing of said photo-resist covering is accomplished using a chemical process.

7. The method of claim 6 wherein said removing said layer of solder-resist material on said photo-resist covering photo-resist is accomplished using a manual peeling operation.

8. The method of claim 6 wherein said removing of said photo-resist covering is accomplished using a chemical stripping operation.

9. The method of claim 1, wherein said substrate comprises thru-holes therein, said thru-holes being filled with conductive paste.

10. The method of claim 9 wherein selected ones of said first plurality of conductors are formed on said substrate over respective ones of said thru-holes.

11. The method of claim 1 further including using hot air leveling to substantially level said solder deposited onto only said second plurality of conductors before said removing said layer of solder-resist material on said photo-resist covering and said photo-resist covering over said first plurality of conductors.

* * * * *